United States Patent
Abe (10) Patent No.: US 6,169,509 B1
(45) Date of Patent: Jan. 2, 2001

(54) SWITCHED CAPACITOR TYPE D/A CONVERTER AND DISPLAY DRIVER

(75) Inventor: Katsumi Abe, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/337,554

(22) Filed: Jun. 22, 1999

(30) Foreign Application Priority Data

Jun. 25, 1998 (JP) .................................................. 10-179213

(51) Int. Cl.[7] .................................................. H03M 1/66
(52) U.S. Cl. ........................... 341/150; 341/144; 341/153
(58) Field of Search .................................... 341/150, 144, 341/153

(56) References Cited

U.S. PATENT DOCUMENTS

| | | | |
|---|---|---|---|
| 5,696,509 | 12/1997 | Maejima | 341/150 |
| 5,952,946 | 9/1999 | Kramer et al. | 341/136 |
| 6,016,115 | 1/2000 | Heubi | 341/161 |

FOREIGN PATENT DOCUMENTS

| | | |
|---|---|---|
| 59-138108 | 8/1984 | (JP) . |
| 62-292013 | 12/1987 | (JP) . |
| 9-259597 | 10/1997 | (JP) . |

*Primary Examiner*—Michael Tokar
*Assistant Examiner*—A. Tran
(74) *Attorney, Agent, or Firm*—McGinn & Gibb, P.C.

(57) ABSTRACT

Disclosed is a switched capacitor type D/A converter, which comprises: an operational amplifier; a plurality of capacitors; a plurality of first switches which alternatively change connection thereof dependently on whether the filter is in an output mode or a reset mode so that the filter realizes an offset canceling function; a voltage source; and a second switch for directly connecting an output of said operational amplifier with said voltage source at a beginning of the reset mode.

15 Claims, 11 Drawing Sheets

SWITCHED CAPACITOR TYPE D/A CONVERTER AND DISPLAY DRIVER

BACKGROUND OF THE INVENTION

1. Field of the Invention

The present invention relates to a switched capacitor filter and more particularly, to a switched capacitor filter having an offset canceling function. The present invention also relates to a display driver having the switched capacitor filter.

2. Description of the Prior Art

A liquid crystal display with thin film transistors (TFT) arranged in a matrix (TFT-LCD) is currently required to achieve a high definition, wide visual field and multi-gradation for use in a monitor.

A liquid crystal display driver for supplying a voltage to drive a liquid crystal such as the TFT-LCD is required accordingly to realize a high precision output voltage, a voltage range of 10–20 V and an output duration of about 12–15 $\mu$s.

Figure 1:
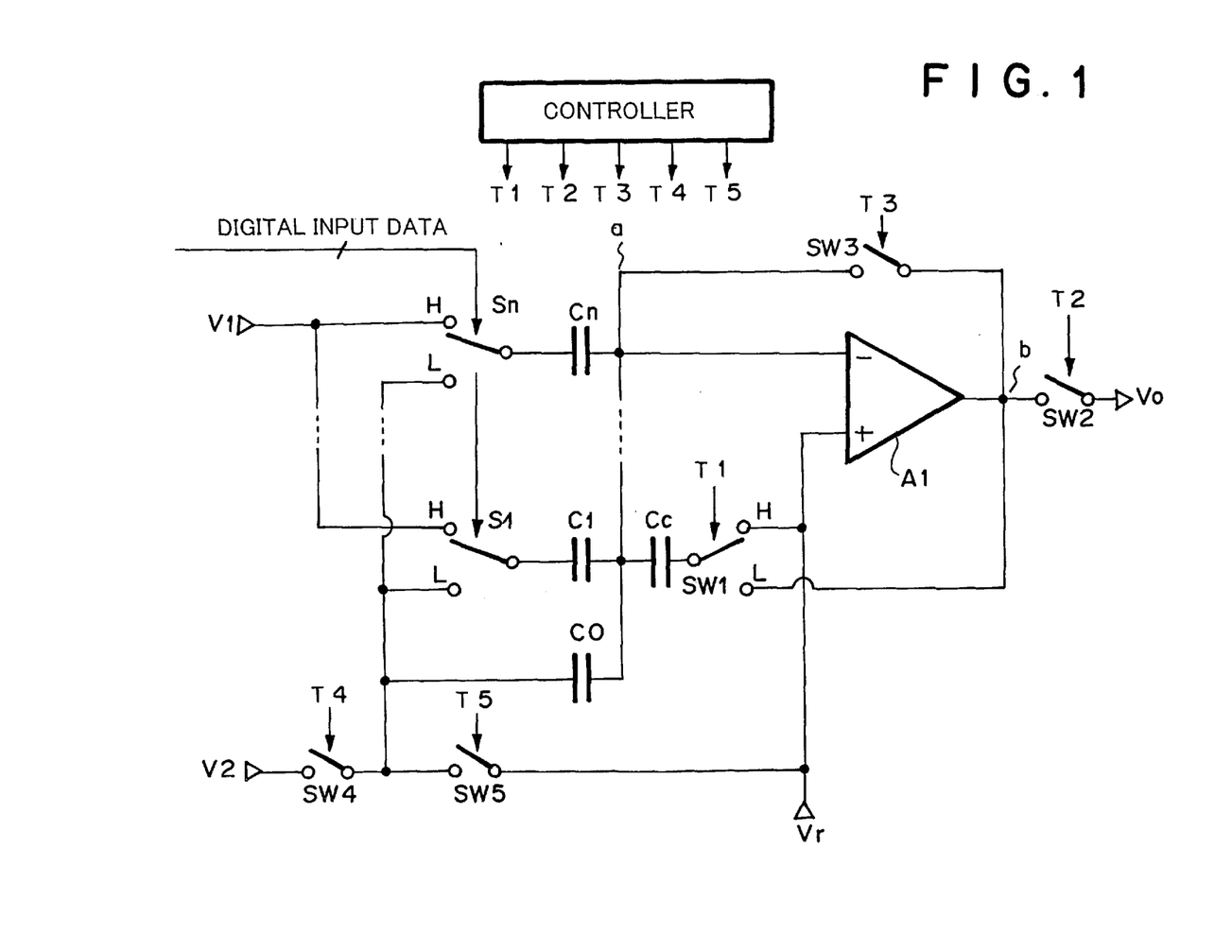
FIG. 1 is a block diagram showing an arrangement of a switched capacitor type D/A converter in the prior art.

As shown in FIG. 1, a conventional switched capacitor type D/A converter with a function for canceling an offset voltage in operational amplifier A1 is employed in the display driver so as to realize the high precision output voltage. The switched capacitor type D/A converters as many as, for example, the number of pixels in one line are arranged on an upper side of the display. This prior art includes level voltages V1, V2 and reference voltage Vr as analog inputs, and comprises input capacitors C0–Cn with a ratio corresponding to the bit number of input digital data and output capacitor Cc connected to the output. It also includes operational amplifier A1 using a line connected to the input capacitors and output capacitor in parallel as the inverting input and using a line from reference voltage Vr as the non-inverting input. It further includes switches S1–Sn for changing connections between the level voltages and the input capacitors in accordance with the input digital data, and switches SW1–SW5 for changing the operation of the switched capacitor type D/A converter. It still further includes controller for controlling switches SW1–5. In case of n-bit digital data input, input capacitors C0–Cn have capacities of C0=Cu, C1=Cu, C2=2×Cu, C3=2×2×Cu, . . . , and Cn (n≧1) has a capacity represented with the product of the (n−1)th power of 2 and Cu where Cu denotes a unit capacity. Magnitudes of level voltages V1 and V2 are two of conditions defining a range of voltages that can be output from the switched capacitor type D/A converter of FIG. 1. The capacity of output capacitor Cc is determined along with level voltages V1 and V2 (V1>V2) so that a ratio between a total sum of the input capacities and the output capacity can realize a desired output variation range of the switched capacitor type D/A converter. A capacity of the output capacitor is represented with Cc=(x×Cu) using unit capacity Cu. Reference voltage Vr is amplified and output in accordance with an amplification degree that is determined on the basis of a capacity ratio between output capacity Cc and the total sum of the input capacities C0–Cn, and accordingly, is a voltage to determine a reference for the output voltage.

Figure 2:
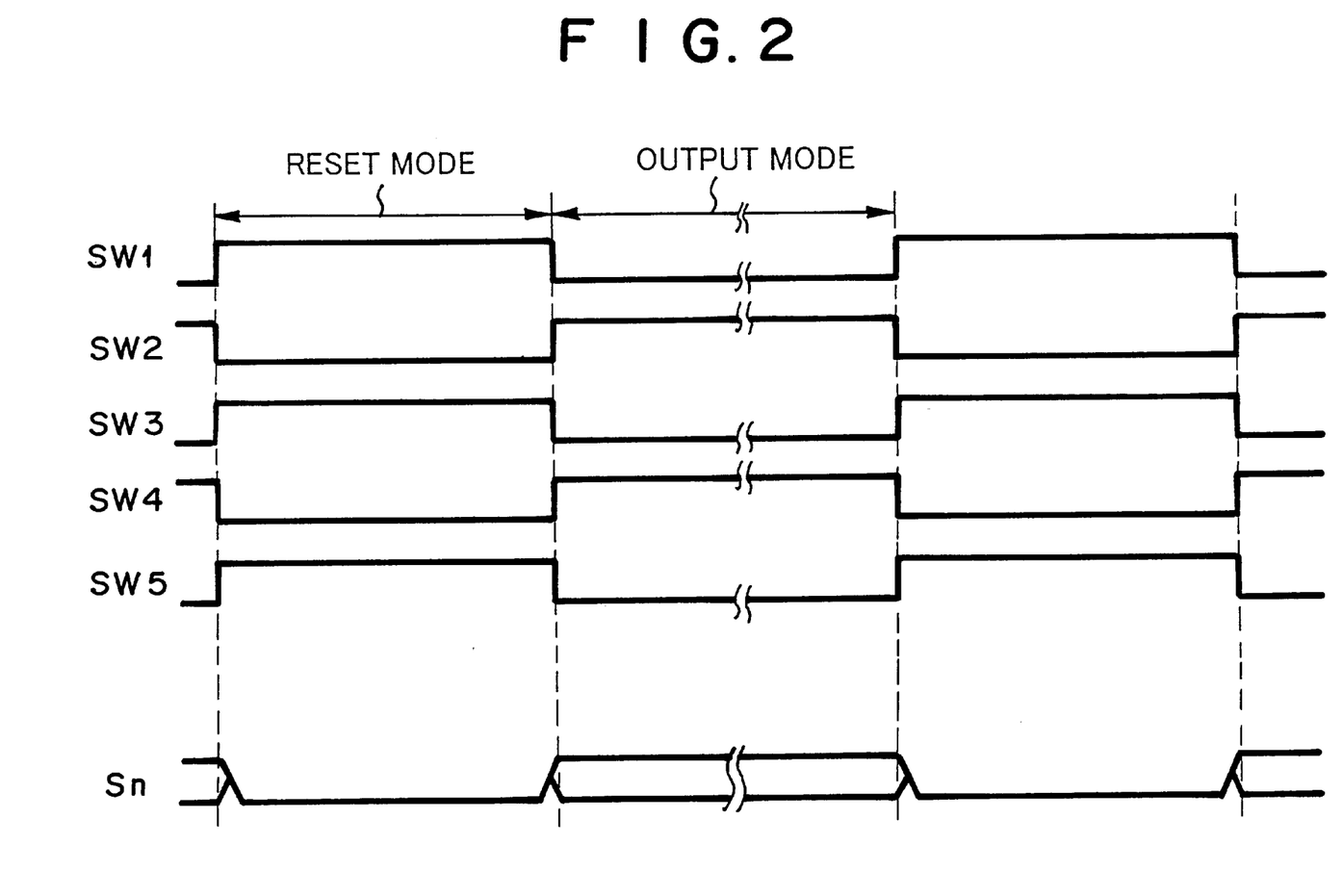
FIG. 2 is a timing chart of operations of the switched capacitor type D/A converter in FIG. 1.

Operations of the conventional switched capacitor type D/A converter with offset canceling function will be explained below with reference to FIG. 2. Switches SW1 and Sn in FIG. 1 are turned to H when levels of respective signals in FIG. 2 becomes high, while they are turned to L when levels of respective signals in FIG. 2 becomes low. Switches SW2 to SW5 are turned on when levels of respective signals in FIG. 2 becomes high, while they are turned off when levels of respective signals in FIG. 2 becomes low.

In initial state (or output mode), SW1 is set to L, SW3 and SW5 are set to OFF, SW2 and SW4 are set to ON, and S1 through Sn are set to either of H state or L state in accordance with input digital data. As described later, output voltage Vo is represented by:

$$Vo=(1+(n'/x))\times Vr-(n'/x)\times(V2+(/n')\times(V1-V2)) \quad (1),$$

where n' denotes the n-th power of 2, and is an amount corresponding to n-bit input data, which exhibits numerals of 1 to (n'−1).

In reset mode subsequent to output mode, SW1 is set to H, SW3 and SW5 are set to ON, SW2 and SW4 are set to OFF, and S1–Sn are set to L. The switched capacitor type D/A converter in this mode functions as a voltage follower and a voltage of Vr+ΔVos (ΔVos is an offset voltage of amplifier A1) appears at point a in the circuit. Therefore, the voltage, Vr+ΔVos, is applied to terminals of input capacitors C0–Cn and output capacitor Cc, at a side to which point a is connected. Vr is also applied to another terminals of input capacitors C0–Cn and output capacitor Cc.

Therefore, the following charges are accumulated in input capacitors C0–Cn and output capacitor Cc:

$$(Vr+\Delta Vos-Vr)\times C0+ \ldots +(Vr+\Delta Vos-Vr)\times Cn+(Vr+\Delta Vos-Vr)\times Cc=\Delta Vos\times(n'+x)\times Cu \quad (2)$$

In output mode subsequent to reset mode, SW1 is set to L, SW3 and SW5 are set to OFF, SW2 and SW4 are set to ON, and S1–Sn are set to H or L in accordance with the input digital data.

In this output mode, the following charges are accumulated in input capacitors C0–Cn and output capacitor Cc:

$$(Va-V1)\times \times Cu+(Va-V2)\times(n'-)\times Cu+(Va-Vo)\times Cc \quad (3),$$

where Va denotes a voltage at point a. As a voltage of Vr is applied to the non-inverting input of operational amplifier A1, Va=Vr+ΔVos results. Right-hand side of Equations (2) and Equation (3) are equal because the charges in the reset and output modes are reserved. Equation (1) is derived by solving the equation relating equations (2) and (3) with respect to Vo while substituting Va=Vr+ΔVos.

The switched capacitor type D/A converter with offset canceling function, which is not affected by the offset voltage, ΔVos, of operational amplifier A1, can be configured with the above operation.

The above prior art is a circuit which satisfies a request for the high precision output among requests to a source driver for TFT-LCD. There is desired a circuit which further satisfies a request for achieving the output voltage range of 10–20 V and a request for realizing the output duration of about 12–15 $\mu$s simultaneously.

Figure 3:
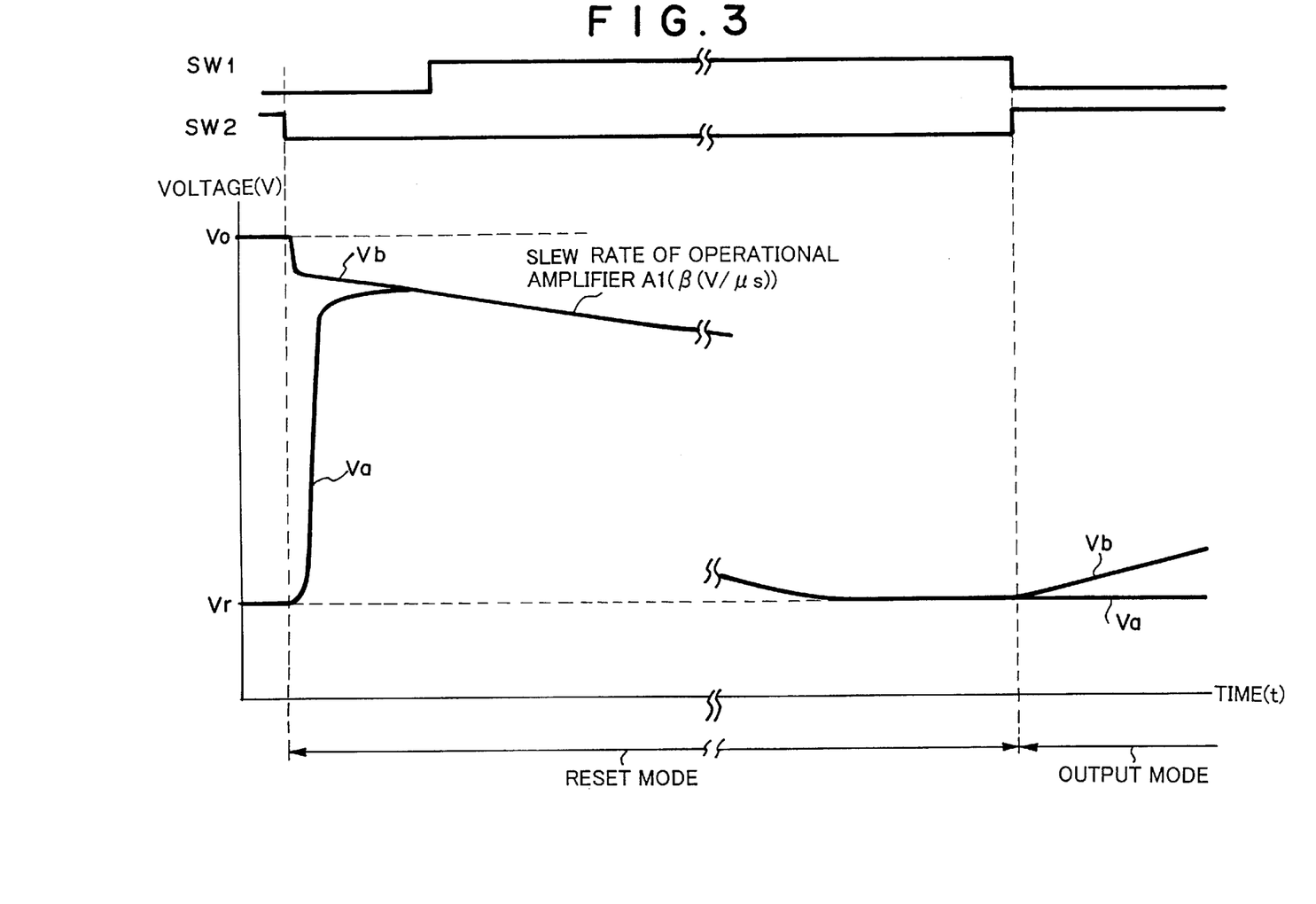
FIG. 3 is a graph showing time variations at points a and in the switched capacitor type D/A converter in FIG. 1.

However, in the prior art, when the request for realizing the output voltage range of 10–20 V is satisfied, there is a large difference between output voltage (Vr+ΔVos) which is output from the circuit functioning as a voltage follower at the final stage in the reset mode and output voltage Vo, which is the last voltage in the last output mode, at the first stage in the reset mode. Therefore, a duration of at least $((Vo-(Vr+\Delta Vos))/\beta)(\mu/s)$ is necessary until the output voltage at (Vr+ΔVos) is stabilized after entering into the reset mode if a slew rate of operational amplifier A1 is $\beta(V/\mu s)$. FIG. 3 shows time variations of the voltages at points a and k in the conventional circuit of FIG. 1. The duration for stabilizing the voltage follower output is referred to as a reset duration and is necessary one inserted between the output modes. If the reset duration becomes long, it is reduced an output duration for actually applying a voltage to TFT-LCD, resulting in a disadvantage that the high precision voltage can not be applied on TFT-LCD.

In the prior art, in order to solve the above disadvantage, the reset duration is shortened by increasing a current flowing in the operational amplifier only in the reset duration and thereby increasing the slew rate of the operational amplifier in the reset duration. According to such approach, a reset duration of 2–3 $\mu$s can be realized currently. The above approach, however, includes the following disadvantages:

a current consumption increases;

the operational amplifier is required to be designed again; and the circuit scale of the operational amplifier becomes large and a layout area thereof increases. Further developing the high definition and large scale of a display will reduce the recent output duration of 12–15 $\mu$s, and accordingly, a further reduction of the reset duration will be required.

SUMMARY OF THE INVENTION

In order to overcome the aforementioned disadvantages, the present invention has been made and accordingly, has an object to provide a switched capacitor type D/A converter with an offset canceling function, which can shorten the reset duration without increase of the circuit scale.

Another object of the present invention is to provide a display driver having such switched capacitor type D/A converter.

According to a first aspect of the present invention, there is provided a switched capacitor type D/A converter, which comprises: an operational amplifier; a plurality of capacitors; a plurality of first switches which alternatively change connection thereof dependently on whether the filter is in an output mode or a reset mode so that the filter realizes an offset canceling function; a voltage source; and a second switch for directly connecting an output of the operational amplifier with the voltage source at a beginning of the reset mode.

The switched capacitor type D/A converter according to the first aspect may comprise a plurality of sets of the voltage source and the second switch, and may further comprise: detecting means for detecting an output voltage of the converter; and selecting means for, based on the detected output voltage, causing any one of the second switches to connect the output of the operational amplifier with a corresponding voltage source at the beginning of the reset mode.

The detecting means may detect the output voltage by detecting input digital data.

The switched capacitor type D/A converter according to the first aspect may further comprise: detecting means for detecting an output voltage; and inhibiting means for, based on the detected output voltage, inhibiting the second switch from connecting the output of the operational amplifier with the voltage source at the beginning of the reset mode.

The detecting means may detect the output voltage by detecting input digital data.

According to a second aspect of the present invention, there is provided a switched capacitor filter, which comprises: an operational amplifier; a plurality of capacitors; a plurality of first switches which alternatively change connection thereof dependently on whether the filter is in an output mode or a reset mode so that the filter realizes an offset canceling function; a voltage source; and a second switch for directly connecting an output of the operational amplifier with the voltage source at a beginning of the reset mode.

The switched capacitor filter according to the second aspect may comprise a plurality of sets of the voltage source and the second switch, and further comprise: detecting means for detecting an output voltage of the filter; and selecting means for, based on the detected output voltage, causing any one of the second switches to connect the output of the operational amplifier with a corresponding voltage source at the beginning of the reset mode.

According to a third aspect of the present invention, there is provided a switched capacitor type D/A converter, which comprises: an operational amplifier; input capacitors, each having a terminal connected to an inverting input terminal of the operational amplifier; an output capacitor having a terminal connected to the inverting input terminal of the operational amplifier; a first voltage source; a second voltage source; a third voltage source connected to a non-inverting input terminal of the operational amplifier; a first switch having a terminal connected to the second voltage source; second switches each connecting each of the input capacitors to the first voltage source or another terminal of the first switch; a third switch connecting the another terminal of the first switch to the non-inverting input terminal; a fourth switch connecting another terminal of the output capacitor to the non-inverting input terminal or an output terminal of the operational amplifier; a fifth switch connecting the inverting input terminal to the output terminal of the operational amplifier; a sixth switch connecting the output terminal of the operational amplifier to a final output terminal; a forth voltage source; and a seventh switch connecting the forth voltage to the output terminal of the operational amplifier.

In the switched capacitor type D/A converter according to the third aspect, it may be executed that the first and sixth switches are turned on, the third, fifth and seventh switches are turned off, the another terminal of the fourth switch is connected to the output terminal of the operational amplifier, and the second switches make connection corresponding to input digital data in output mode; the third and seventh switches are turned on, the first, fifth, and sixth switches are turned off, the another terminal of the fourth switch is connected to the output terminal of the operational amplifier, and the second switches make connection between respective input capacitors and the one terminal of the third switch in first reset mode following to the output mode; and the third and fifth switches are turned on, the first, sixth, and seventh switches are turned off, the another terminal of the fourth switch is connected to the non-inverting input terminal, and the second switches make connection between respective input capacitors and the one terminal of the third switch in second reset mode following to the first reset mode.

The switched capacitor type D/A converter according to the third aspect may comprise a plurality set of the fourth voltage source and the seventh switch, and further comprise: detecting means for detecting an output voltage of the converter; and selecting means for, based on the detected output, causing any one of the seventh switches to the output of the operational amplifier with a corresponding the fourth voltage source in the first reset mode.

The detecting means may detect the output voltage by detecting the input digital data.

The switched capacitor type D/A converter according to the third aspect may further comprises: detecting means for detecting an output voltage of the converter; and inhibiting means for, based on the detected output voltage, inhibiting the first reset mode.

The detecting means may detect the output voltage by detecting the input digital data.

According to a fourth aspect of the present invention, there is provided a display driver comprising the switched capacitor type D/A converter according to the first or second aspect.

Other features and advantages of the invention will be apparent from the following description of the preferred embodiments thereof.

BRIEF DESCRIPTION OF THE DRAWINGS

The present invention will be more fully understood from the following detailed explanation with reference to the accompanying drawings in which.

DETAILED DESCRIPTION OF THE PREFERRED EMBODIMENTS

[First Embodiment]

Figure 4:
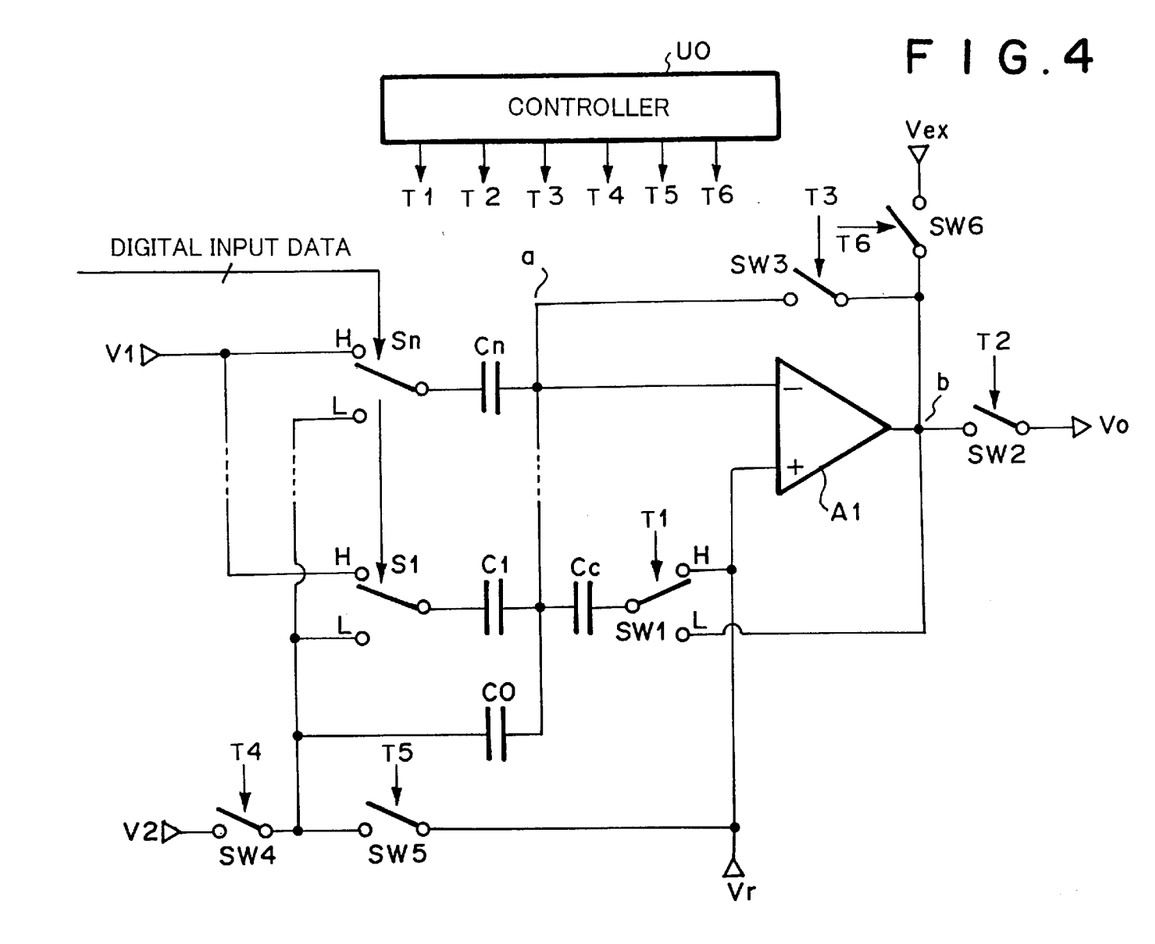
FIG. 4 is a block diagram showing an arrangement of a switched capacitor type D/A converter according to a first embodiment of the present invention.

FIG. 4 shows an embodiment of a D/A converter of an n-bit switched capacitor type having an offset canceling function (switched capacitor type D/A converter) according to the present invention. This embodiment includes level voltages V1, V2, reference voltage Vr and external drive voltage Vex as analog inputs, and comprises input capacitors C0–Cn with a ratio corresponding to the bit number of input digital data and output capacitor Cc connected to the output side. It also includes operational amplifier A1 using a line connected to the input capacitors and output capacitor in parallel as the inverting input and using a line from reference voltage Vr as the non-inverting input. It further includes switches S1–Sn for switching connections of input capacitors C0–Cn to level voltages V1 or V2 in accordance with the input digital data, and switches SW1–SW6 for changing the operation of the switched capacitor type D/A converter.

It still further includes controller U0 for controlling switches SW1–6. In case of n-bit digital data input, input capacitors C0–Cn have capacities of C0=Cu, C1=Cu, C2=2×Cu, C3=2×2×Cu, . . . , and Cn (n≧1) has a capacity represented with the product of the (n−1)th power of 2 and Cu where Cu denotes a unit capacity. Magnitudes of level voltages V1 and V2 are one of conditions defining a range of a voltage that can be output from the switched capacitor type D/A converter. The capacity of output capacitor Cc is determined along with level voltages V1 and V2 (V1>V2) so that a ratio between a total sum of the input capacities and the output capacity can realize a desired output variation range of the switched capacitor type D/A converter. A capacity of the output capacitor is represented by Cc=(x×Cu) where Cu is a unit capacity. Reference voltage Vr, which is amplified in accordance with an amplification degree that is determined on the basis of a capacity ratio between output capacity Cc and the total sum of the input capacities C0–Cn, determines a reference for the output voltage. External drive voltage Vex, which is not present in the prior art, forces operational amplifier A1 to operate at a high speed when applied to the output of operational amplifier A1 prior to performing the offset canceling operation. Among the switches for changing the operation of the switched capacitor type D/A converter, SW6 controls the connection of external drive voltage Vex.

Operations of the circuit shown in FIG. 4 will be explained next.

Figure 5:
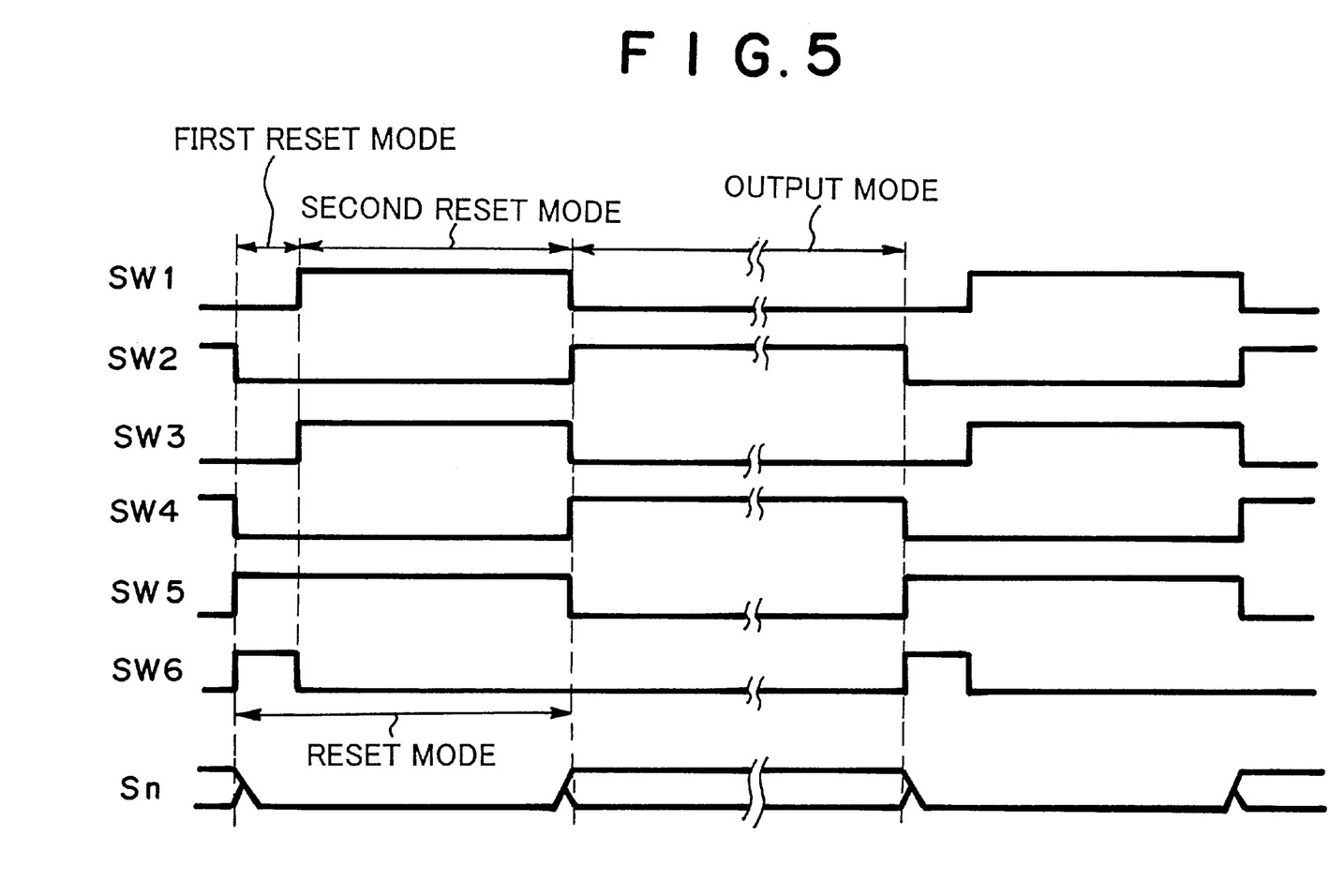
FIG. 5 is a timing chart of operations of the switched capacitor type D/A converter in FIG. 4.

FIG. 5 shows a timing chart for each switch of the present invention. Switches SW1 and Sn in FIG. 1 are turned to H when levels of respective signals in FIG. 2 becomes high, while they are turned to L when levels of respective signals in FIG. 2 becomes low. Switches SW2 to SW6 are turned on when levels of respective signals in FIG. 2 becomes high, while they are turned off when levels of respective signals in FIG. 2 becomes low.

The circuit of FIG. 4 generates an output voltage of Vo in an initial state. In the initial state, SW1 is connected to L, SW3, SW5 and SW6 is turned off, and SW 2 and SW4 are turned on. In the Initial state, switched S1–Sn connect a level voltage V1 or V2 and input capacitors C0–Cn in accordance with the input digital data, respectively.

Output voltage Vo in the initial state is represented by Equation (1) similarly to the prior art.

When mode is transferred to a first reset mode subsequent to the initial state, SW1 is connected to L, SW2–4 are turned off, SW5 and SW6 are turned on, and S1–Sn are connected to L. At this moment, external drive voltage Vex is applied to the output of operational amplifier A1. Reference voltage Vr is applied to terminals of input capacitors C0–Cn at a side to which the inverting input of operational amplifier A1 is not connected. The voltage at point b becomes Vex because external drive voltage Vex is applied directly. On the other hand, the voltage at point a which is connected to the inverting input of operational amplifier A1 hardly varies from voltage Vr in the output mode. A current of several 100 $\mu$A flows into the output stage of operational amplifier A1 because external drive voltage Vex is applied to point b or the output of operational amplifier A1. Thus, the internal state of operational amplifier A1 varies faster than the slew rate of operational amplifier A1. The first reset mode requires only a very short time (several 10 ns) accordingly.

When mode is transferred to a second reset mode subsequent to the first reset mode, SW1 is connected to H, SW3 and SW 5 are turned on, and SW2, SW4 and SW6 turned off. At this state, the switched capacitor type D/A converter functions as a voltage follower, and points a and b are short-circuited to each other. A voltage of Vr+$\Delta$Vos ($\Delta$Vos is an offset voltage of amplifier A1) is applied on point a. Therefore, the voltage of Vr+Δ Vos is applied to terminals of input capacitors C0–Cn and output capacitor Cc at a side to which point a is connected. Voltage Vr is applied to terminals of input capacitors C0–Cn and output capacitor Cc at the other side.

Therefore, the charges represented by Equation (2) are accumulated in input capacitors C0–Cn and output capacitor Cc.

The duration necessary for the second reset mode is a duration between the time when the first reset mode is completed and the time when the voltage at point a is stabilized at Vr+ΔVos in accordance with the slew rate of operational amplifier A1. The duration necessary for the second reset mode depends on the internal state of the operational amplifier at the time of the finish of the first reset mode. The closer the internal operation state of the operational amplifier to the state of outputting Vr as a voltage follower in the second reset mode at the time of the finish of the first reset mode, the shorter is the duration necessary for the second reset mode can be made. Therefore, external drive voltage Vex necessary for the first reset mode is determined so as to set the duration necessary for the second reset mode the shortest when the difference between Vo and Vr at the initial state is the largest.

When mode is transferred to the output mode subsequent to the second reset mode, SW1 is connected to L, SW2 and SW4 are turned on, SW3, SW5 and SW6 are turned off, and S1–Sn are connected to H or L in accordance with the digital data.

The charges represented by Equation (3) are accumulated in input capacitors C0–Cn and output capacitor Cc in the output mode where Va denotes the voltage at point a. As Vr is applied to the non-inverting input of operational amplifier A1, Va =Vr+ΔVos results.

Right-hand side of Equation (2) and Equation (3) are equal because the charges in the second reset and output modes are reserved. Equation (1) is derived by solving the equation relating equations (2) and (3) with respect to Vo while substituting Va=Vr+ΔVos.

The switched capacitor type D/A converter with offset canceling function, which is not affected by the offset voltage, ΔVos, of operational amplifier A1, can be configured with the above operation.

[Second Embodiment]

A second embodiment will be explained next.

The first embodiment includes only one external drive voltage Vex. The second embodiment of the present invention prepares two external drive voltages supposing a case where the above reference voltage Vr is determined near the center of the output voltage range of the switched capacitor type D/A converter. By selecting one of the external drive voltages dependently on whether output voltage Vo at the initial state is lager or smaller than the reference voltage Vr, the sum of the first reset mode duration and second reset mode duration or the total reset mode duration can be shortened in either case. As output voltage Vo at the initial state is represented by Equation (1), output voltage Vo can be calculated using Equation (1).

Figure 6:
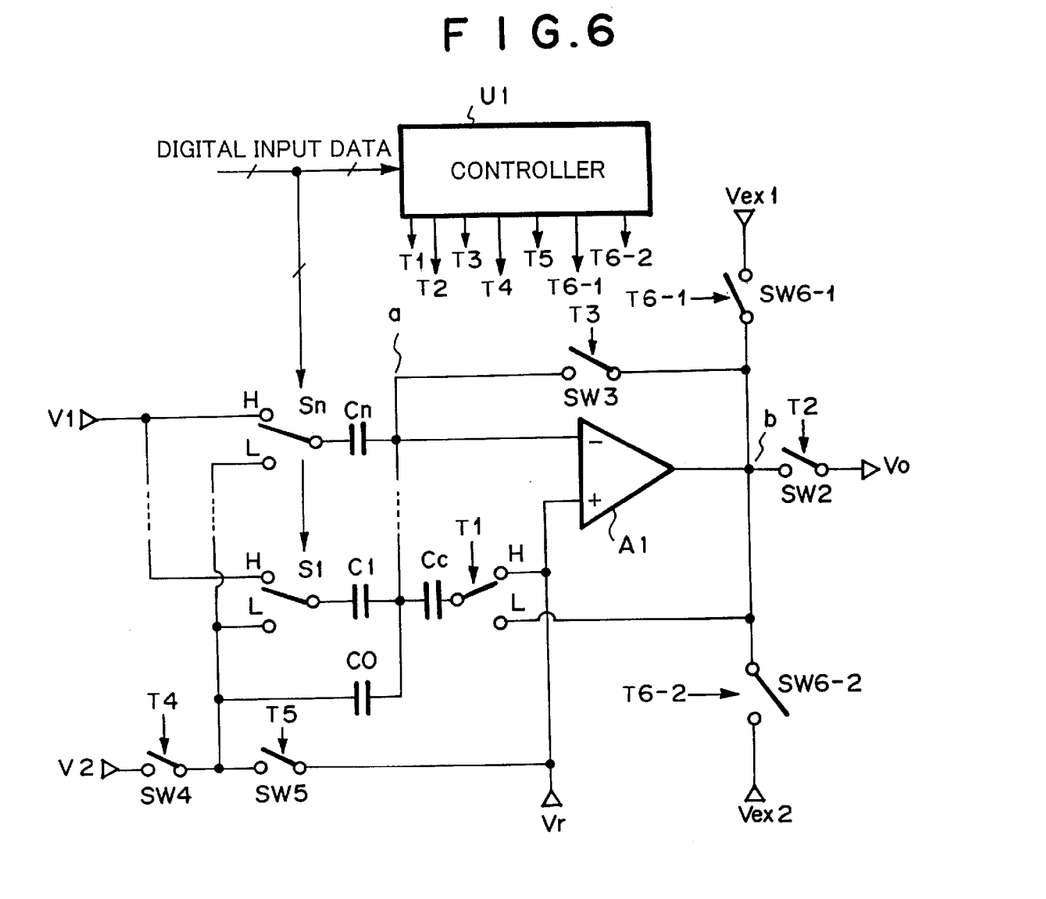
FIG. 6 is a block diagram showing an arrangement of a switched capacitor type D/A converter according to a second embodiment of the present invention.

The second embodiment can be realized by the following arrangement and operation. As shown in FIG. 6, in addition to configuration of the first embodiment, there is provided two reference voltages Vex1 and Vex2, switches SW6-1 and SW6-2 corresponding to respective reference voltages and similar to SW6 in the first embodiment. Controller U0 of the first embodiment is modified to controller U1 so as to include a function of computing whether output voltage Vo at the initial state is lager or smaller than the reference voltage Vr based on the digital input data at the initial state and Equation (1). At the time of beginning the first reset mode, controller U1 selects reference voltage Vex1 by closing SW6-1 if Vo>Vr or reference voltage Vex2 by closing SW6-2 otherwise.

[Third Embodiment]

A third embodiment will be explained next.

There is a case where the duration required for an operation which does not include the first reset mode but the second reset mode as the operation of the prior art is shorter than the duration required for an operation which includes both of the first and second reset mode as the first embodiment for a certain range of output voltage Vo. Such range of output voltage Vo is determined for each kind of operational amplifier and output voltage Vo at the initial state is represented with Equation (1). Therefore, in this embodiment, only the second reset mode is performed if it is determined based on the input digital data that the duration required for an operation which does not include the first reset mode but the second reset mode is shorter than the duration required for an operation which includes both of the first reset mode and second reset mode, while both of the first and second modes are performed otherwise. According to this embodiment, the current required for the first reset mode performed in the first embodiment can be reduced and the switched capacitor type D/A converter with offset canceling function can be realized without losing the advantage of the first embodiment.

Figure 7:
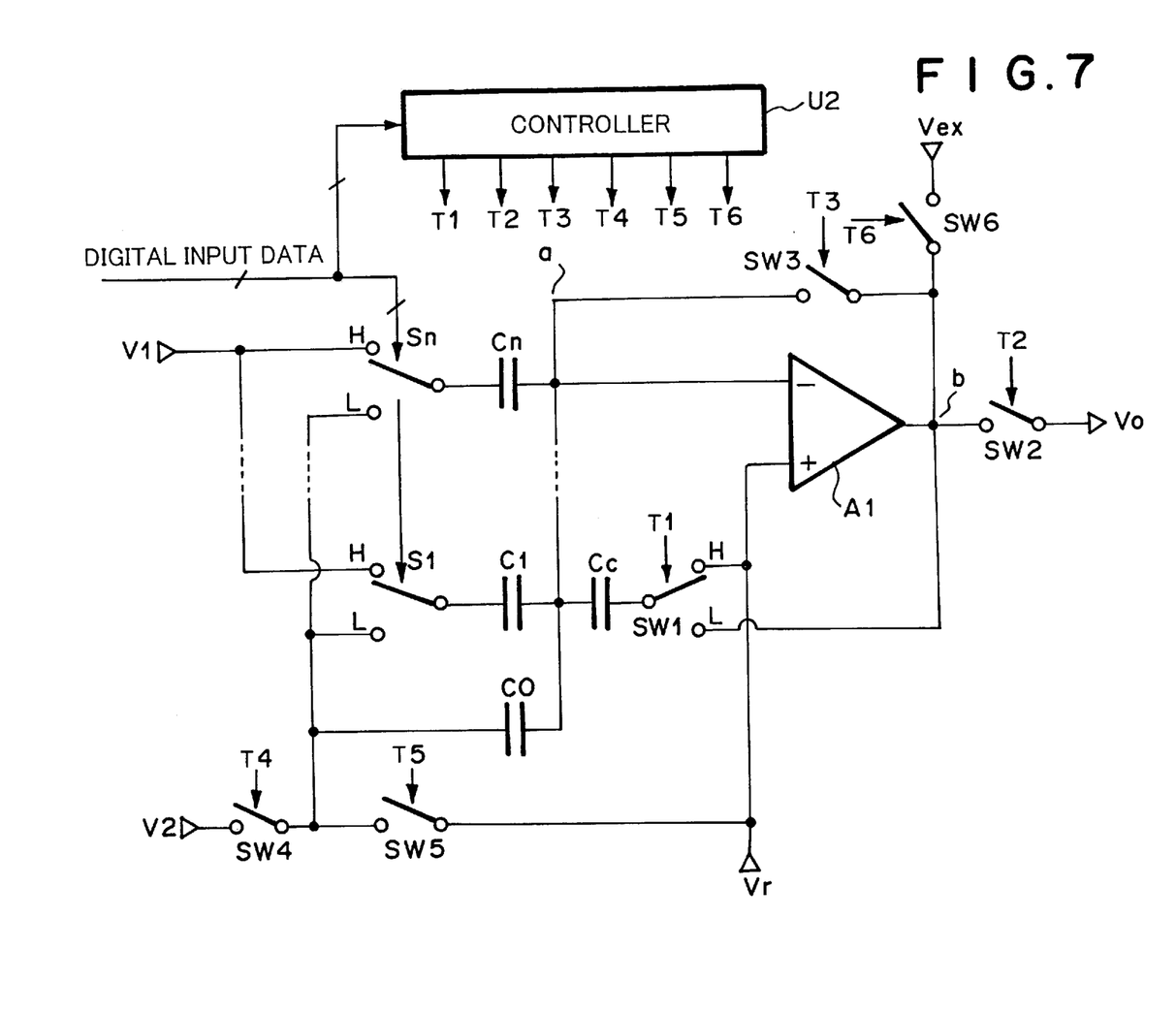
FIG. 7 is a block diagram showing an arrangement of a switched capacitor type D/A converter according to a third embodiment of the present invention.

The third embodiment can be realized by the following arrangement and operation. As shown in FIG. 7, controller U0 of the first embodiment is modified to controller U2 so as to include a function of computing whether output voltage Vo at the initial state is in the aforementioned range based on the digital input data at the initial state and Equation (1) and of determining whether to perform only the second reset mode or both of the first and second mode based on the computation.

[Fourth Embodiment]

A fourth embodiment will be explained next.

This embodiment is a combination of the second and third embodiments. If Vo>Vr+(≧0), operation in both of the first and second reset modes are executed while Vex1 is selected as the external drive voltage. If Vr+≧Vo≧Vr−β(β≧0), operation in only the second reset mode is executed. If Vo<Vr−β, operation in both of the first and second reset modes are executed while Vex2 is selected as the external drive voltage. The values of and β may be set so that the maximum reset duration becomes the shortest. According to this embodiment, the reset duration can be shortened and an redundant current consumption can be reduced.

Figure 8:
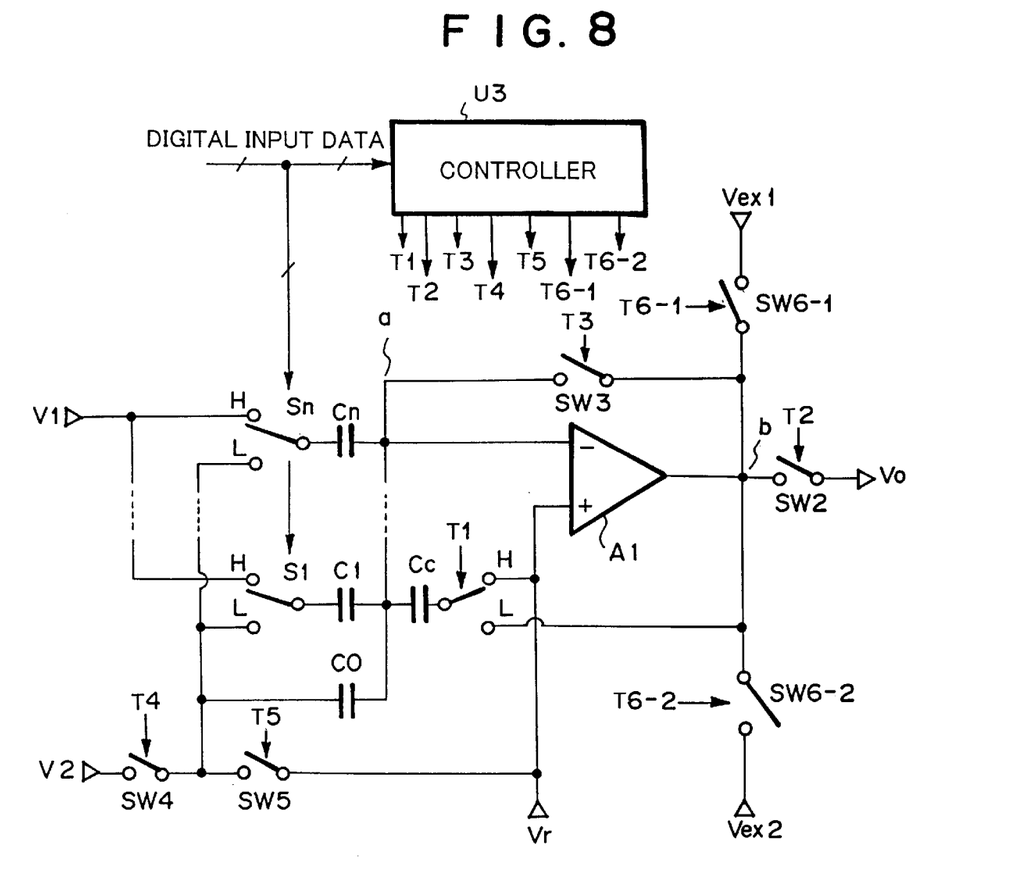
FIG. 8 is a block diagram showing an arrangement of a switched capacitor type D/A converter according to a fourth embodiment of the present invention.

The fourth embodiment can be realized by the following arrangement and operation. As shown in FIG. 8, the arrangement of the fourth embodiment is similar to that of the second embodiment. However controller U1 of the second embodiment is modified to controller U3. Controller U3 computes whether Vo>Vr+, Vr+≧Vo≧Vr−β, or Vo<Vr−β based on the digital input data at the initial state and Equation (1) and selects one of the aforementioned three operation based on the computation.

[Fifth Embodiment]

A fifth embodiment will be explained next.

This embodiment elevates the slew rate of the operational amplifier by increasing the current flowing into the operational amplifier when operating in the second reset mode for the first through fourth embodiments. According to this embodiment, the reset time can be shortened relative to the prior art because the level necessary for driving in the second mode is smaller than that of the conventional case.

[Sixth Embodiment]

Figure 10:
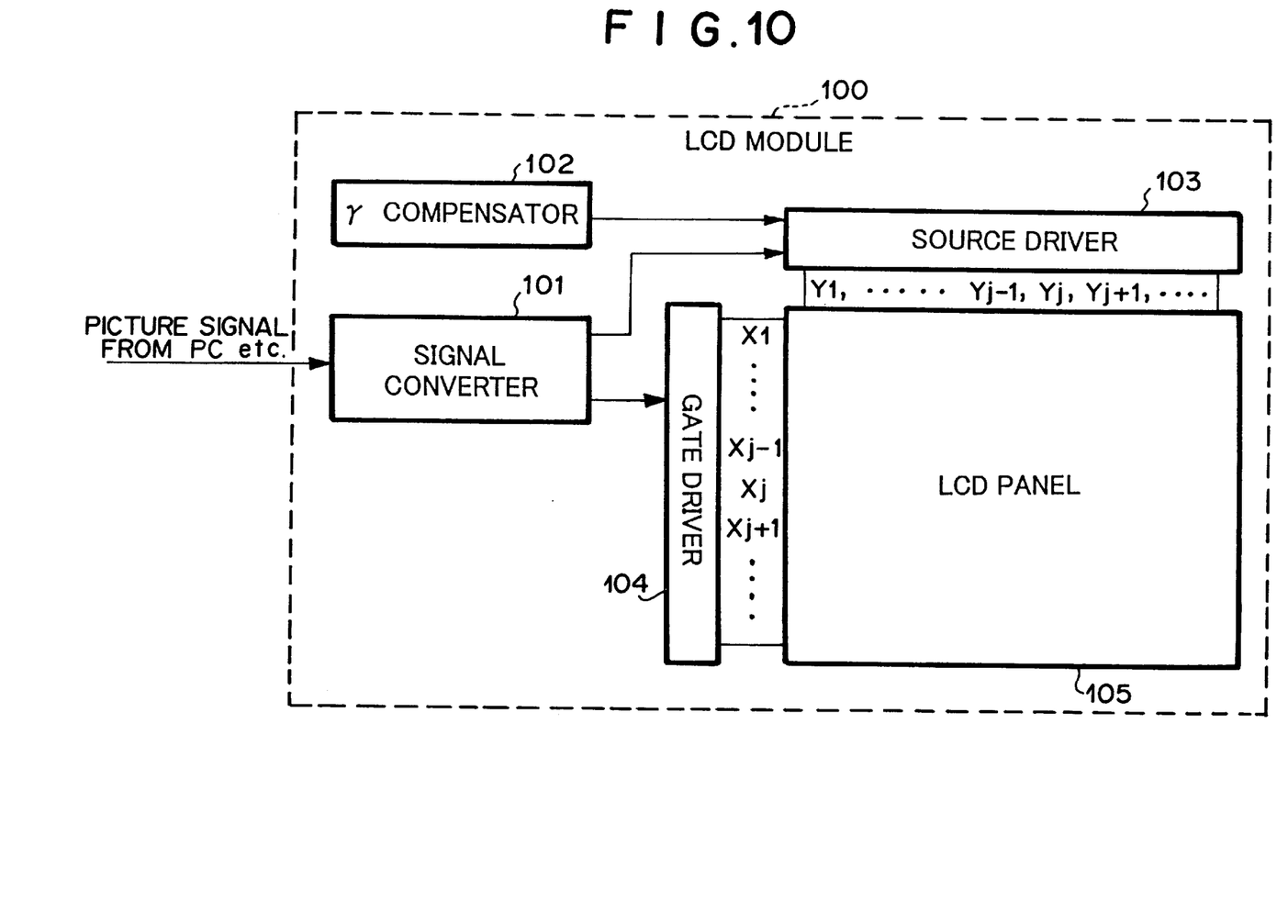
FIG. 10 is a block diagram showing a display driver according to a sixth embodiment of the present invention and a LCD panel driven by the display driver.

FIG. 10 is a block diagram showing a display driver according to sixth embodiment of the present invention and LCD panel 105 driven by the display driver which are included in LCD module 100.

The display driver includes signal converter 101, γ compensator, source driver 103, and gate driver 104.

Signal converter receives a picture signal from the external such as PC. γ compensator 102 supplies a voltage for γ compensation to source driver 103. Signal converter 101 converts the picture signal so as to supply signals to source driver 103. The signals include digital RGB data, a start signal for causing source driver 103 to determine the time to input the data, a clock signal for driving source driver 103, and an output timing signal to determine the time to apply an analog signal from the D/A converter to LCD panel 105. γ compensation effects that the digital RGB data matches the transparency-voltage characteristics of LCD 105. Source driver 103 applies the analog signal to LCD panel 105 in accordance with signals from signal converter 101 and γ compensator 102. Signal converter 101 also supplies a signal for scanning LCD panel 105 to gate driver 104 to gate driver 104.

Figure 11:
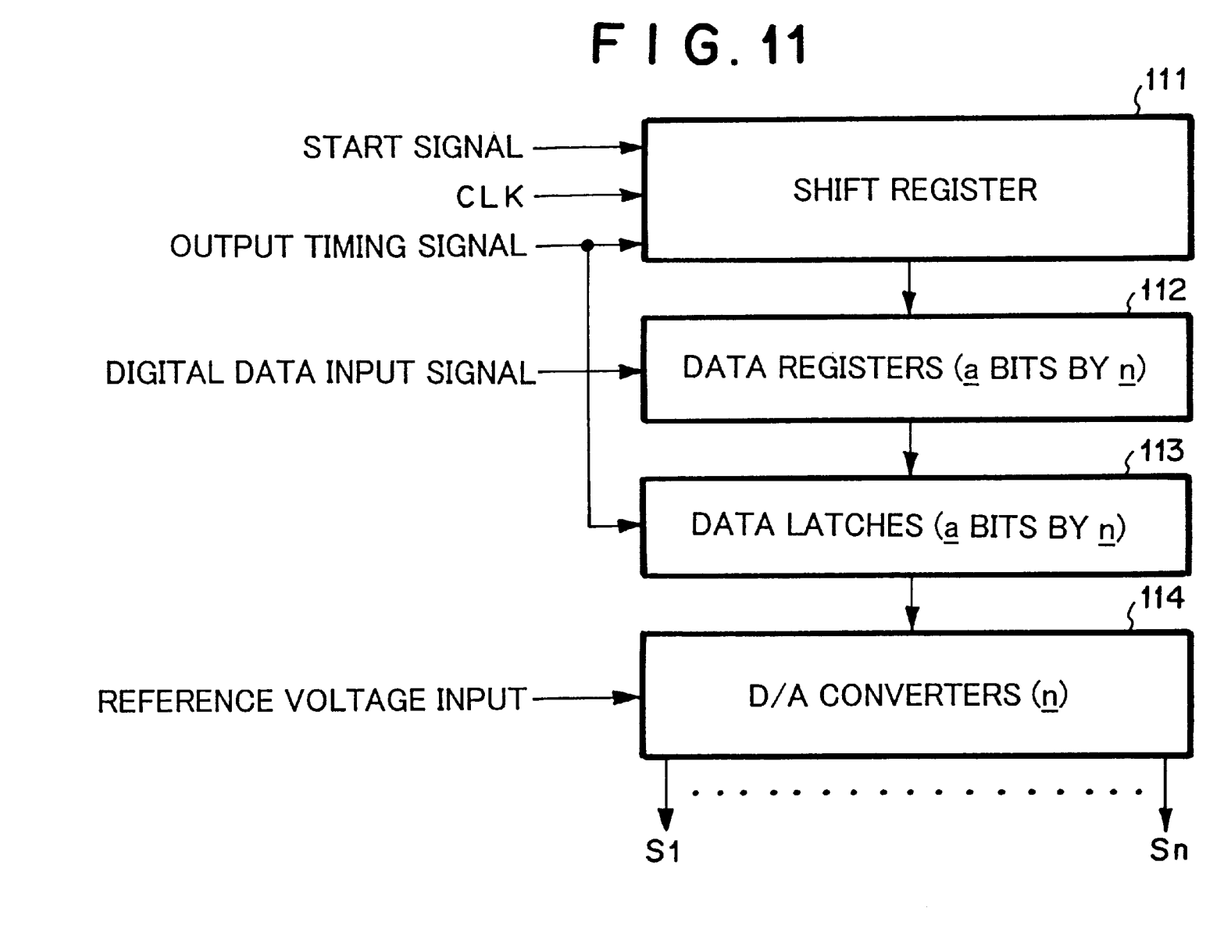
FIG. 11 is a block diagram showing the source driver shown in FIG. 10.

FIG. 11 is a block diagram showing source driver 103 shown in FIG. 10.

Shift register 111 is composed of registers connected in series. All of the registers are reset by the output timing signal. The start signal is propagated in registers in synchronism with the clock. Output of each register is used as a latch signal of each of data registers 112. The digital data input signal is supplied to all the data registers 112 as many as a by n. Each data register latches the digital data input data when the latch signal becomes active. All of data latches as many as a by n sample outputs of the data registers in synchronism with the output timing signal and latch them until the next output timing signal becomes active again. D/A converters as many as n convert outputs of data latches. Each of D/A converter is that according to any one of the first embodiment through fifth embodiment.

The conventional switched capacitor type D/A converter with offset canceling function operates only in the second reset mode and output mode without operating in the first reset mode. The duration required in the second reset mode is determined by the output range of the switched capacitor type D/A converter, the magnitude of reference voltage Vr, and the slew rate of the operational amplifier for use in the switched capacitor type D/A converter.

The present invention changes the internal state of the operational amplifier in the switched capacitor type D/A converter with the external voltage in the first reset mode provided prior to the second reset mode, and thereafter makes the operational amplifier operate as a voltage follower in the second reset mode. Therefore, the voltage that the operational amplifier drives as the voltage follower can be reduced relative to the prior art, and the duration necessary for the second reset mode can be shortened.

Figure 9:
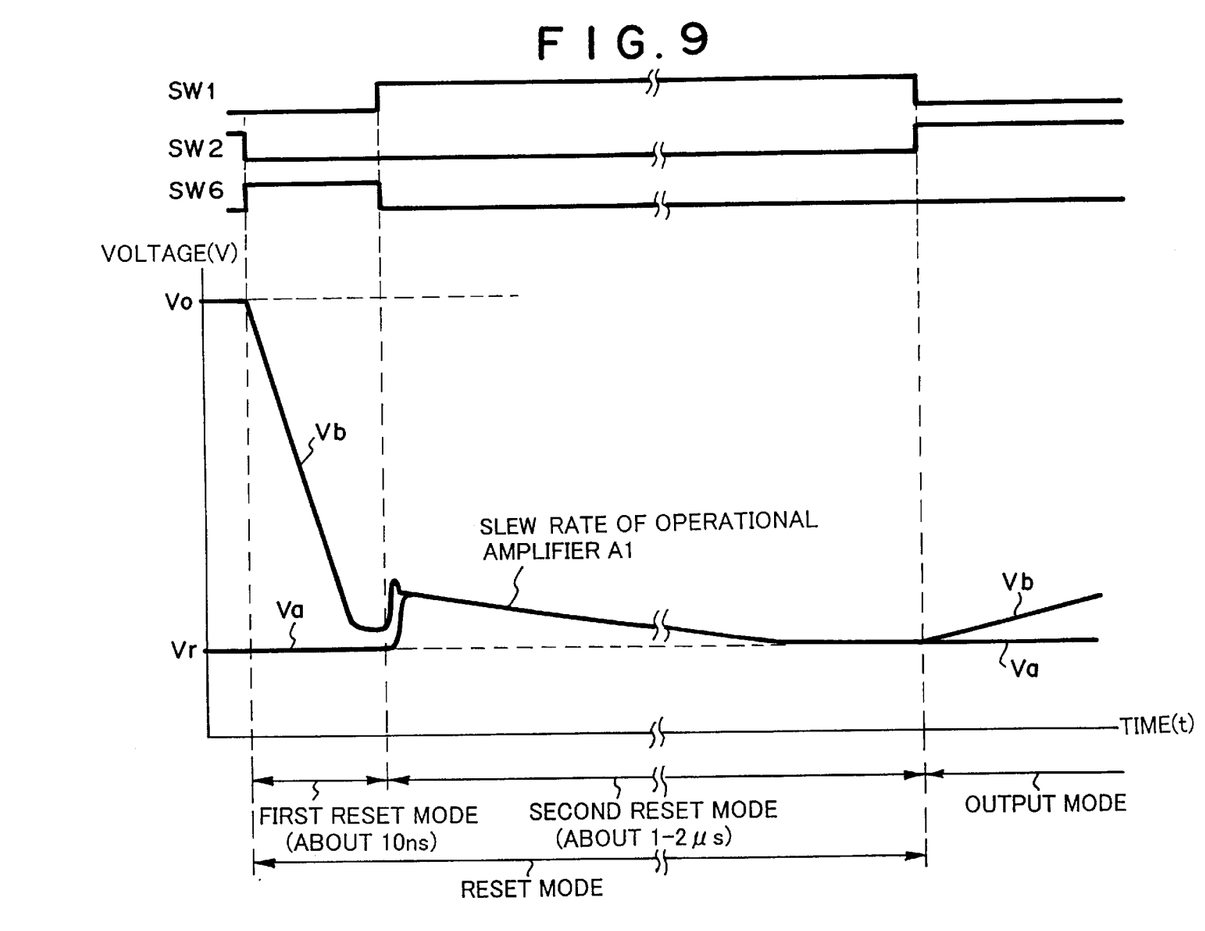
FIG. 9 is a graph showing time variations at points a and in the switched capacitor type D/A converter in FIG. 4.

FIG. 9 shows time variations of the voltages at points a and b in the circuit shown in FIG. 4 according to the embodiment of the present invention. FIG. 3 shows time dependence of the voltages at points a and b in the circuit shown in FIG. 1 according to the prior art. The initial voltage at point a in the second reset mode of FIG. 9 becomes a voltage closer to Vr relative to FIG. 1 by setting the first reset mode to several 10 ns, and the second reset mode can be completed in 1–2 μs. Therefore, the reset duration necessary for the two output modes can be shortened as compared to the prior art.

According to the present invention, although a current different from that in the usual operation flows into the operational amplifier in the first reset mode, the time period of the first reset mode duration is several 10 ns. Therefore, the whole current consumption increases little.

The present invention can be performed by applying a voltage from external of the operational amplifier. Therefore, the circuit inside the operational amplifier is not required to be modified.

Additional component of the present invention is only one switch in the circuit arrangement as compared to the prior art. Therefore, the circuit area necessary for the switched capacitor type D/A converter of the present invention is almost the same with that of the prior art. All switched capacitor type D/A converters in the liquid crystal driver can share one external drive voltage source which hardly increases the circuit area.

Although the present invention has been shown and explained with respect to the preferred mode embodiments thereof, it should be understood by those skilled in the art that the forgoing and various other changes, omissions, and additions in the form and detail thereof may be made therein without departing from the spirit and scope of the present invention.

What is claimed is:

1. A switched capacitor type D/A converter, which comprises:

an operational amplifier;

a plurality of capacitors;

a plurality of first switches which alternatively change connection thereof dependently on whether the filter is in an output mode or a reset mode so that the filter realizes an offset canceling function;

a voltage source; and a second switch for directly connecting an output of said operational amplifier with said voltage source at a beginning of the reset mode.

2. The switched capacitor type D/A converter according to claim 1, wherein said voltage source and said second switch are increased to plural so as to form a plurality of sets of the voltage source and the second switch, and which further comprises:

detecting means for detecting an output voltage of the converter; and selecting means for, based on the detected output voltage, causing any one of said second switches to connect the output of said operational amplifier with a corresponding voltage source at the beginning of the reset mode.

3. The switched capacitor type D/A converter according to claim 2, wherein said detecting means detects the output voltage by detecting input digital data.

4. The switched capacitor type D/A converter according to claim 1, which further comprises:

detecting means for detecting an output voltage; and inhibiting means for, based on the detected output voltage, inhibiting said second switch from connecting the output of said operational amplifier with said voltage source at the beginning of the reset mode.

5. The switched capacitor type D/A converter according to claim 4, wherein said detecting means detects the output voltage by detecting input digital data.

6. A switched capacitor filter, which comprises:

an operational amplifier;

a plurality of capacitors;

a plurality of first switches which alternatively change connection thereof dependently on whether the filter is in an output mode or a reset mode so that the filter realizes an offset canceling function;

a voltage source; and a second switch for directly connecting an output of said operational amplifier with said voltage source at a beginning of the reset mode.

7. The switched capacitor filter according to claim 6, wherein said voltage source and said second switch are increased to plural so as to form a plurality of sets of the voltage source and the second switch, and which further comprises:

detecting means for detecting an output voltage of the filter; and selecting means for, based on the detected output voltage, causing any one of said second switches to connect the output of said operational amplifier with a corresponding voltage source at the beginning of the reset mode.

8. A switched capacitor type D/A converter, which comprises:

an operational amplifier;

input capacitors, each having a terminal connected to an inverting input terminal of said operational amplifier;

an output capacitor having a terminal connected to said inverting input terminal of said operational amplifier;

a first voltage source;

a second voltage source;

a third voltage source connected to a non-inverting input terminal of said operational amplifier;

a first switch having a terminal connected to said second voltage source;

second switches each connecting each of said input capacitors to said first voltage source or another terminal of said first switch;

a third switch connecting said another terminal of said first switch to said non-inverting input terminal;

a fourth switch connecting another terminal of said output capacitor to said non-inverting input terminal or an output terminal of said operational amplifier;

a fifth switch connecting said inverting input terminal to said output terminal of said operational amplifier;

a sixth switch connecting said output terminal of said operational amplifier to a final output terminal;

a forth voltage source; and a seventh switch connecting said forth voltage to said output terminal of said operational amplifier.

9. The switched capacitor type D/A converter according to claim 8, wherein said first and sixth switches are turned on, said third, fifth and seventh switches are turned off, said another terminal of said fourth switch is connected to said output terminal of said operational amplifier, and said second switches make connection corresponding to input digital data in output mode;

said third and seventh switches are turned on, said first, fifth, and sixth switches are turned off, said another terminal of said fourth switch is connected to said output terminal of said operational amplifier, and said second switches make connection between respective input capacitors and said one terminal of said third switch in first reset mode following to said output mode; and said third and fifth switches are turned on, said first, sixth, and seventh switches are turned off, said another terminal of said fourth switch is connected to said non-inverting input terminal, and said second switches make connection between respective input capacitors and said one terminal of said third switch in second reset mode following to said first reset mode.

10. The switched capacitor type D/A converter according to claim 9, wherein said fourth voltage source and said seventh switch are increased to plural so as to form a plurality set of said fourth voltage source and said seventh switch, and which further comprises:

detecting means for detecting an output voltage of the converter; and selecting means for, based on the detected output, causing any one of said seventh switches to the output of said operational amplifier with a corresponding said fourth voltage source in said first reset mode.

11. The switched capacitor type D/A converter according to claim 10, wherein said detecting means detects the output voltage by detecting said input digital data.

12. The switched capacitor type D/A converter according to claim 9, which further comprises:

detecting means for detecting an output voltage of the converter; and inhibiting means f or, based on the detected output voltage, inhibiting said first reset mode.

13. The switched capacitor type D/A converter according to claim 12, wherein said detecting means detects the output voltage by detecting said input digital data.

14. A display driver comprising the switched capacitor type D/A converter according to claim 1.

15. A display driver comprising the switched capacitor type D/A converter according to claim 8.

* * * * *